United States Patent
Kang

(10) Patent No.: US 9,299,403 B2
(45) Date of Patent: Mar. 29, 2016

(54) SEMICONDUCTOR DEVICES AND SEMICONDUCTOR SYSTEMS INCLUDING THE SAME

(71) Applicant: SK hynix Inc., Icheon-si Gyeonggi-do (KR)

(72) Inventor: Hee Won Kang, Seoul (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 14/737,744

(22) Filed: Jun. 12, 2015

(65) Prior Publication Data

US 2015/0287447 A1 Oct. 8, 2015

Related U.S. Application Data

(62) Division of application No. 14/025,989, filed on Sep. 13, 2013, now Pat. No. 9,082,513.

(30) Foreign Application Priority Data

May 23, 2013 (KR) .......................... 10-2013-0058628

(51) Int. Cl.

| G11C 7/10 | (2006.01) |
|---|---|
| G11C 7/22 | (2006.01) |
| G11C 11/4093 | (2006.01) |
| G11C 11/4076 | (2006.01) |
| G11C 29/00 | (2006.01) |
| G11C 29/12 | (2006.01) |
| G11C 29/08 | (2006.01) |
| G11C 29/36 | (2006.01) |
| G11C 8/10 | (2006.01) |
| G11C 29/26 | (2006.01) |
| G11C 29/02 | (2006.01) |

(52) U.S. Cl.
CPC .............. *G11C 7/1084* (2013.01); *G11C 7/222* (2013.01); *G11C 29/08* (2013.01); *G11C 29/36* (2013.01); *G11C 7/106* (2013.01); *G11C 7/1057* (2013.01); *G11C 8/10* (2013.01); *G11C 11/4076* (2013.01); *G11C 29/028* (2013.01); *G11C 29/12* (2013.01); *G11C 2029/2602* (2013.01)

(58) Field of Classification Search
CPC ...... G11C 7/222; G11C 7/106; G11C 7/1057; G11C 11/4076; G11C 8/10; G11C 29/028; G11C 2029/2602; G11C 29/12
USPC .............. 365/189.05, 191, 194, 193, 201, 63, 365/230.06
See application file for complete search history.

(56) References Cited

U.S. PATENT DOCUMENTS

| 6,026,039 A * | 2/2000 | Kim ........................ G11C 29/02 365/201 |
|---|---|---|
| 2008/0091378 A1* | 4/2008 | Jeong ........................ G01K 7/01 702/130 |
| 2008/0165596 A1* | 7/2008 | Cheon ................ G11C 29/1201 365/189.15 |

(Continued)

*Primary Examiner* — Ly D Pham
(74) *Attorney, Agent, or Firm* — William Park & Associates Ltd.

(57) ABSTRACT

Semiconductor devices are provided. The semiconductor device includes a control signal generator and a first data input unit. The control signal generator generates an inverted control signal including a first bit and a second bit using a decoded signal in response to a test enable signal. The first data input unit inverts a first bit of input data in response to the first bit of the inverted control signal to generate a first bit of first internal data. Further, the first data input unit inverts a second bit of the input data in response to the second bit of the inverted control signal to generate a second bit of the first internal data.

12 Claims, 8 Drawing Sheets

(56) References Cited

U.S. PATENT DOCUMENTS

| | | | |
|---|---|---|---|
| 2009/0002029 A1* | 1/2009 | Kim | G01R 31/31724 326/80 |
| 2013/0034121 A1* | 2/2013 | Lee | G01K 3/005 374/152 |
| 2013/0107649 A1* | 5/2013 | Cho | G11C 29/06 365/201 |
| 2014/0006886 A1* | 1/2014 | Song | G11C 29/46 714/718 |
| 2014/0177314 A1* | 6/2014 | Chu | G11C 17/16 365/96 |

* cited by examiner

FIG.2

| TM_CNT<2> | TM_CNT<1> | BLCS<4> | BLCS<3> | BLCS<2> | BLCS<1> |
|---|---|---|---|---|---|
| L | L | L | L | L | H |
| L | H | L | L | H | L |
| H | L | L | H | L | L |
| H | H | H | L | L | L |

SEMICONDUCTOR DEVICES AND SEMICONDUCTOR SYSTEMS INCLUDING THE SAME

CROSS-REFERENCE TO RELATED APPLICATION

The present application claims priority under 35 U.S.C. 119(a) to Korean Application No. 10-2013-0058628, filed on May 23, 2013, in the Korean Intellectual Property Office, which is incorporated herein by reference in its entirety.

BACKGROUND

Embodiments of the present disclosure relate generally to semiconductor devices, and more particularly to semiconductor devices for controlling topologies of input data and semiconductor systems including the same.

As semiconductor devices become more highly integrated, a test time required to evaluate various characteristics of the semiconductor devices using a test equipment has been increased to guarantee the reliability thereof. Thus, the semiconductor devices (also referred to as semiconductor chips) are generally designed to include self test circuits embedded therein in order to reduce the test time and production cost. A compressive parallel test utilizing the self test circuits may be performed by writing the same data in memory cells of a memory core and simultaneously reading out the data stored in the memory cells in order to verify that the data read out are identical to written data and in order to detect which memory cell has an error. The compressive parallel test may be performed using the minimum number of data pads (e.g., DQ pad) to remarkably reduce the test time of the semiconductor devices.

In general, the compressive parallel test may store the same data in all memory cells of the memory core. However, in some cases, different kinds of tests may be performed by storing data having different topologies in some memory cells (i.e., cell arrays) included in the memory core.

SUMMARY

Various embodiments are directed to semiconductor devices and semiconductor systems including the same.

According to some embodiments, a semiconductor device includes a control signal generator and a first data input unit. The control signal generator generates an inverted control signal including a first bit and a second bit using a decoded signal in response to a test enable signal. The first data input unit inverses a first bit of input data in response to the first bit of the inverted control signal to generate a first bit of first internal data. Further, the first data input unit inverses a second bit of the input data in response to the second bit of the inverted control signal to generate a second bit of the first internal data.

According to further embodiments, a semiconductor device includes a first data input unit, a second data input unit and a third input unit. The first data input unit inverses a first bit of input data in response to a first bit of a first inverted control signal generated from decoded signals to generate a first bit of first internal data while a first test enable signal is enabled. In addition, the first data input unit inverses a second bit of the input data in response to a second bit of the first inverted control signal to generate a second bit of the first internal data while the first test enable signal is enabled. The second data input unit inverses the first bit of the input data in response to a first bit of a second inverted control signal generated from the decoded signals to generate a first bit of second internal data while a second test enable signal is enabled. Further, the second data input unit inverses the second bit of the input data in response to a second bit of the second inverted control signal to generate a second bit of the second internal data while the second test enable signal is enabled. The third input unit buffers the first bit of the input data to output the buffered data of the first bit of the input data as a first bit of third internal data. Moreover, the third input unit buffers the second bit of the input data to output the buffered data of the second bit of the input data as a second bit of the third internal data.

According to further embodiments, a semiconductor system includes a controller and a semiconductor device. The controller generates a test count signal, first and second test enable signals, and input data. The semiconductor device determines inversion of respective bits of the input data in response to a first inverted control signal generated from decoded signals generated by decoding the test count signal to generate first internal data when the first test enable signal is enabled. Furthermore, the semiconductor device determines inversion of respective bits of the input data in response to a second inverted control signal generated from the decoded signals to generate second internal data when the second test enable signal is enabled.

BRIEF DESCRIPTION OF THE DRAWINGS

Embodiments of the inventive concept will become more apparent in view of the attached drawings and accompanying detailed description, in which:

FIG. 2 is a table illustrating an operation of a decode included in the system of FIG. 1;

DETAILED DESCRIPTION OF THE EMBODIMENTS

Example embodiments concept will be described hereinafter with reference to the accompanying drawings. However, the example embodiments described herein are for illustrative purposes only and are not intended to limit the scope of the inventive concept.

Figure 1:
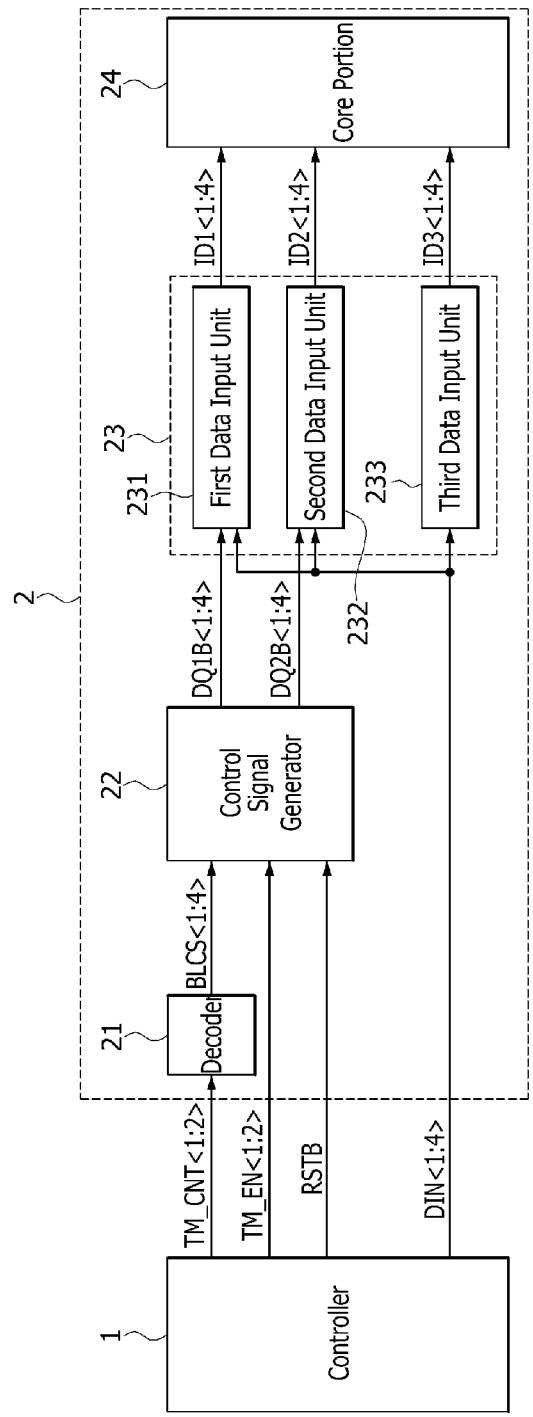
FIG. 1 is a block diagram illustrating a configuration of a system having a semiconductor device according to an embodiment.

As illustrated in FIG. 1, a system according to an embodiment of the present invention may be configured to include a controller 1 and a semiconductor device 2. The semiconductor device 2 may be configured to include a decoder 21, a control signal generator 22, an internal data generator 23 and a core portion 24. The internal data generator 23 may be configured to include a first data input unit 231, a second data input unit 232 and a third data input unit 233.

The controller 1 may provide first and second test enable signals TM_EN<1:2>, first and second test count signals TM_CNT<1:2>, a reset signal RSTB and input data DIN<1:4> to the semiconductor device 2. The controller 1 may apply the first and second test enable signals TM_EN<1:2>, which are sequentially enabled, to the semiconductor device 2 while the test count signals TM_CNT<1:2> and the input data DIN<1:4>, having specific levels, are applied to the semiconductor device 2. The controller 1 may apply the reset signal RSTB, which is enabled, to the semiconductor device 2 after the test count signals TM_CNT<1:2>, which are sequentially enabled, are applied to the semiconductor device 2.

The decoder 21 may decode the test count signals TM_CNT<1:2> to generate decoded signals BLCS<1:4>. As illustrated in FIG. 2, a first bit BLCS<1> of the decoded signals BLCS<1:4> may be enabled to have a logic "H" level when both the first and second test count signals TM_CNT<1:2> have logic "L" levels, a second bit BLCS<2> of the decoded signals BLCS<1:4> may be enabled to have a logic "H" level when the first and second test count signals TM_CNT<1:2> have a logic "H" level and a logic "L" level respectively, a third bit BLCS<3> of the decoded signals BLCS<1:4> may be enabled to have a logic "H" level when the first and second test count signals TM_CNT<1:2> have a logic "L" level and a logic "H" level respectively, and a fourth bit BLCS<4> of the decoded signals BLCS<1:4> may be enabled to have a logic "H" level when both the first and second test count signals TM_CNT<1:2> have logic "H" levels. The logic "L" level represents a logic "low" level and the logic "H" level represents a logic "high" level throughout the specification. A combination of the logic levels of the decoded signals BLCS<1:4> responsive to the logic levels of the first and second test count signals TM_CNT<1:2> may be set to be different according to an embodiment of the present invention.

The control signal generator 22 may output first inverted control signals DQ1B<1:4> in response to the decoded signals BLCS<1:4> when the first test enable signal TM_EN<1> is enabled. The control signal generator 22 may output second inverted control signals DQ2B<1:4> in response to the decoded signals BLCS<1:4> when the second test enable signal TM_EN<2> is enabled. For example, the control signal generator 22 may output the decoded signals BLCS<1:4> as the first inverted control signals DQ1B<1:4> if the first test enable signal TM_EN<1> is enabled, and the control signal generator 22 may output the decoded signals BLCS<1:4> as the second inverted control signals DQ2B<1:4> if the second test enable signal TM_EN<2> is enabled. The control signal generator 22 may reset the first and second inverted control signals DQ1B<1:4> and DQ2B<1:4> when the reset RSTB is enabled and applied to the control signal generator 22. A detailed configuration and operation of the control signal generator 22 will be described with reference to FIG. 3 later.

The first data input unit 231 may output first internal data ID1<1:4> in response to the first inverted control signals DQ1B<1:4> and the input data DIN<1:4>. For example, the first data input unit 231 may receive the first inverted control signals DQ1B<1:4> to invert or buffer each bit of the input data DIN<1:4> and to output the inverted or buffered input data as the first internal data ID1<1:4>. The second data input unit 232 may output second internal data ID2<1:4> in response to the second inverted control signals DQ2B<1:4> and the input data DIN<1:4>. For example, the second data input unit 232 may receive the second inverted control signals DQ2B<1:4> to invert or buffer each bit of the input data DIN<1:4> and to output the inverted or buffered input data as the second internal data ID2<1:4>. The third data input unit 233 may output third internal data ID3<1:4> in response to the input data DIN<1:4>. For example, the third data input unit 233 may buffer the input data DIN<1:4> to output the buffered input data as third internal data ID3<1:4>. A detailed configuration and operation of the first, second and third data input units 231, 232 and 233 according to an embodiment of the present invention will be described with reference to FIGS. 4, 5 and 6 later.

The core portion 24 may include cell arrays, that is, a plurality of memory cells configured to receive the first, second and third internal data ID1<1:4>, ID2<1:4> and ID3<1:4> to store the internal data therein in a write operation mode while a test is performed. In an embodiment of the present invention, the write operation may be identical to that of general test procedures. Thus, a detailed description to a circuit used in the write operation will be omitted.

Figure 3:
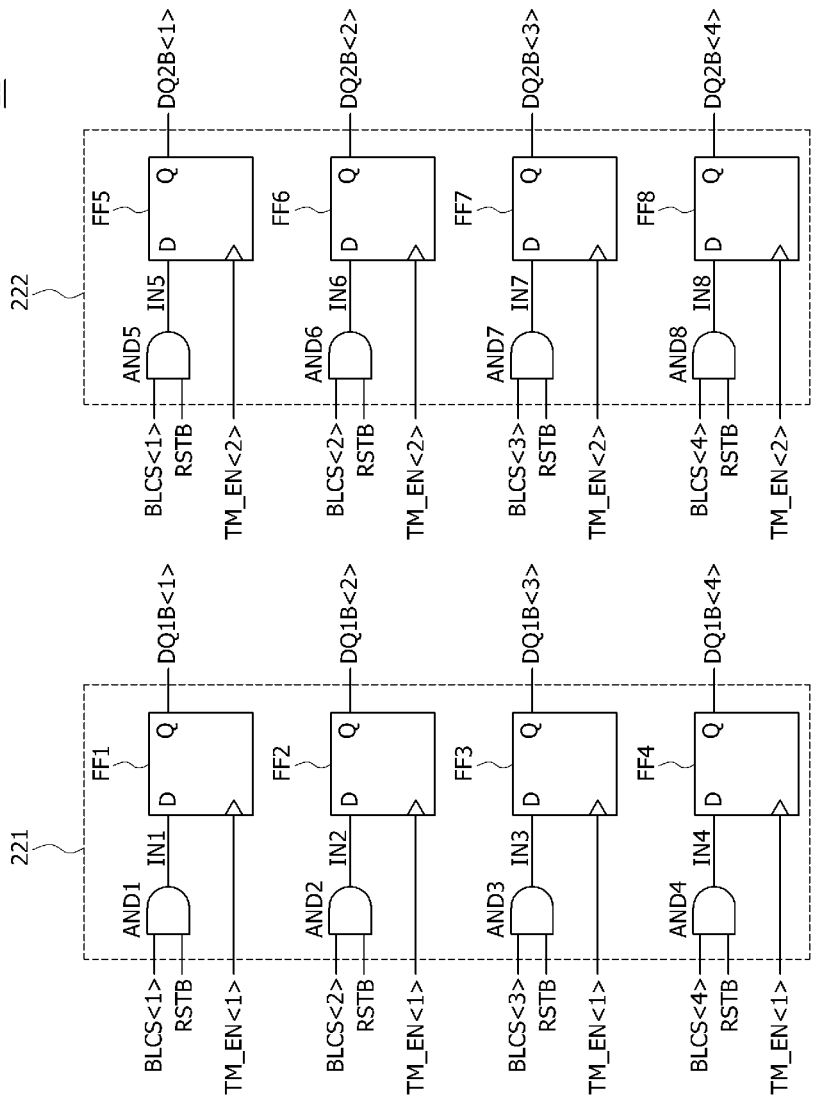
FIG. 3 is circuit diagram illustrating a configuration of a control signal generator included in the system of FIG. 1.

Referring to FIG. 3, the control signal generator 22 may be configured to include a first transmitter 221 and a second transmitter 222. The first transmitter 221 may be configured to include first to fourth AND gates AND1, AND2, AND3 and AND4 and first to fourth flip flops FF1, FF2, FF3 and FF4. The second transmitter 222 may be configured to include fifth to eighth AND gates AND5, AND6, AND7 and AND8 and fifth to eighth flip flops FF5, FF6, FF7 and FF8. The first transmitter 221 may output the decoded signals BLCS<1:4> as the first inverted control signals DQ1B<1:4> when the first test enable signal TM_EN<1> is enabled to have a logic "H" level and the reset signal RSTB is disabled to have a logic "H" level. That is, when the decoded signals BLCS<1>, BLCS<2>, BLCS<3> and BLCS<4> have a logic "L" level, a logic "L" level, a logic "H" level and a logic "L" level respectively, the first to fourth AND gates AND1, AND2, AND3 and AND4 may output a first internal signal IN1 having a logic "L" level, a second internal signal IN2 having a logic "L" level, a third internal signal IN3 having a logic "H" level and a fourth internal signal IN4 having a logic "L" level respectively and the first to fourth flip flops FF1, FF2, FF3 and FF4 may output the first inverted control signals DQ1B<1> having a logic "L" level, the first inverted control signals DQ1B<2> having a logic "L" level, the first inverted control signals DQ1B<3> having a logic "H" level and the first inverted control signals DQ1B<4> having a logic "L" level respectively.

The second transmitter 221 may output the decoded signals BLCS<1:4> as the second inverted control signals DQ2B<1:4> when the second test enable signal TM_EN<2> is enabled to have a logic "H" level and the reset signal RSTB is disabled to have a logic "H" level. That is, when the decoded signals BLCS<1>, BLCS<2>, BLCS<3> and BLCS<4> have a logic "L" level, a logic "L" level, a logic "H" level and a logic "L" level respectively, the fifth to eighth AND gates AND5, AND6, AND7 and AND8 may output a fifth internal signal IN5 having a logic "L" level, a sixth internal signal IN6 having a logic "L" level, a seventh internal signal IN3 having a logic "H" level and an eighth internal signal IN8 having a logic "L" level respectively and the fifth to eighth flip flops FF5, FF6, FF7 and FF8 may output the second inverted control signals DQ2B<1> having a logic "L" level, the second inverted control signals DQ2B<2> having a logic "L" level, the second inverted control signals DQ2B<3> having a logic "H" level and the second inverted control signals DQ2B<4> having a logic "L" level respectively.

Figure 4:
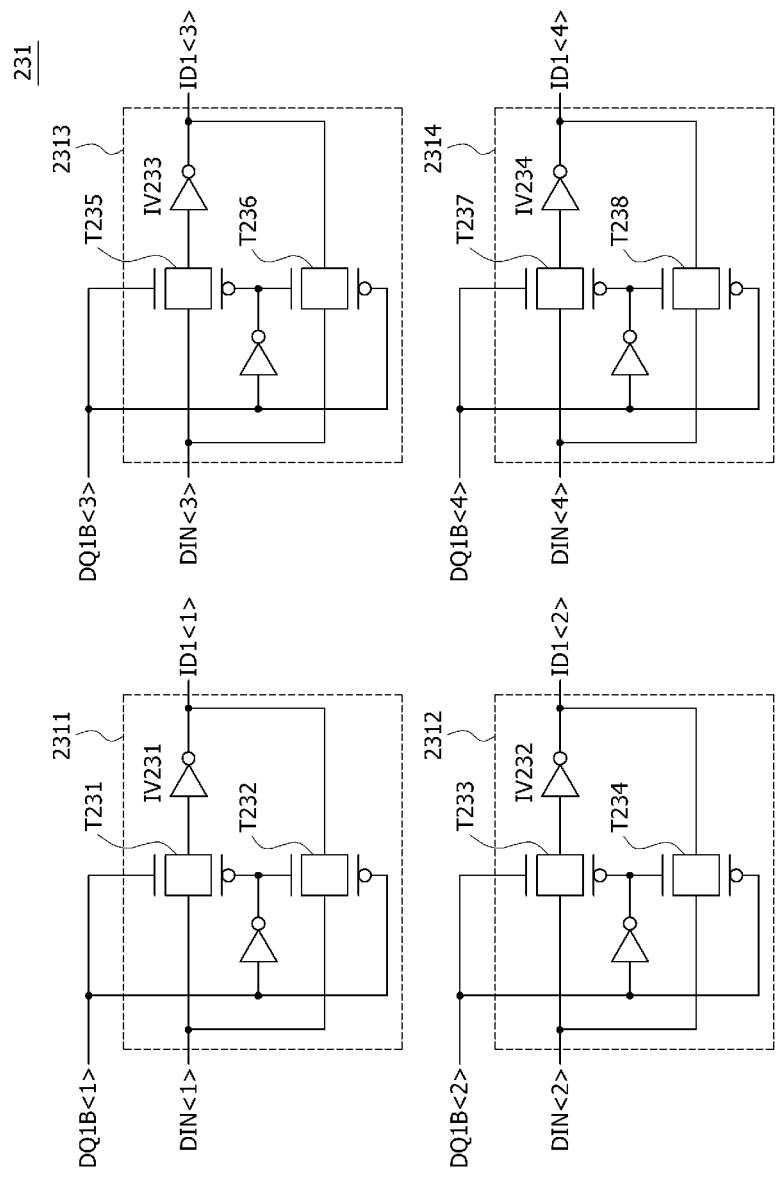
FIG. 4 is circuit diagram illustrating a configuration of a first data input unit included in the system of FIG. 1.

Referring to FIG. 4, the first data input unit 231 may be configured to include a first selection transmitter 2311, a second selection transmitter 2312, a third selection transmitter 2313 and a fourth selection transmitter 2314. The first selection transmitter 2311 may include a pass gate T231 which is turned on when a first bit DQ1B<1> of the first inverted control signals DQ1B<1:4> has a logic "H" level and an inverter IV231 which is connected to an output terminal of the pass gate T231. Thus, the first selection transmitter 2311 may invert a first bit DIN<1> of the input data DIN<1:4> to output the inverted data of the first bit DIN<1> as a first bit ID1<1> of the first internal data ID1<1:4> when the first bit DQ1B<1> has a logic "H" level. The first selection transmitter 2311 may further include a pass gate T232 which is turned on when the first bit DQ1B<1> of the first inverted control signals DQ1B<1:4> has a logic "L" level. Thus, the first selection transmitter 2311 may buffer the first bit DIN<1> of the input data DIN<1:4> to output the buffered data of the first bit DIN<1> as the first bit ID1<1> of the first internal data ID1<1:4> when the first bit DQ1B<1> has a logic "L" level.

The second selection transmitter 2312 may include a pass gate T233 which is turned on when a second bit DQ1B<2> of the first inverted control signals DQ1B<1:4> has a logic "H" level and an inverter IV232 which is connected to an output terminal of the pass gate T233. Thus, the second selection transmitter 2312 may invert a second bit DIN<2> of the input data DIN<1:4> to output the inverted data of the second bit DIN<2> as a second bit ID1<2> of the first internal data ID1<1:4> when the second bit DQ1B<2> has a logic "H" level. The second selection transmitter 2312 may further include a pass gate T234 which is turned on when the second bit DQ1B<2> of the first inverted control signals DQ1B<1:4> has a logic "L" level. Thus, the second selection transmitter 2312 may buffer the second bit DIN<2> of the input data DIN<1:4> to output the buffered data of the second bit DIN<2> as the second bit ID1<2> of the first internal data ID1<1:4> when the second bit DQ1B<2> has a logic "L" level.

The third selection transmitter 2313 may include a pass gate T235 which is turned on when a third bit DQ1B<3> of the first inverted control signals DQ1B<1:4> has a logic "H" level and an inverter IV233 which is connected to an output terminal of the pass gate T235. Thus, the third selection transmitter 2313 may invert a third bit DIN<3> of the input data DIN<1:4> to output the inverted data of the third bit DIN<3> as a third bit ID1<3> of the first internal data ID1<1:4> when the third bit DQ1B<3> has a logic "H" level. The third selection transmitter 2313 may further include a pass gate T236 which is turned on when the third bit DQ1B<3> of the first inverted control signals DQ1B<1:4> has a logic "L" level. Thus, the third selection transmitter 2313 may buffer the third bit DIN<3> of the input data DIN<1:4> to output the buffered data of the third bit DIN<3> as the third bit ID1<3> of the first internal data ID1<1:4> when the third bit DQ1B<3> has a logic "L" level.

The fourth selection transmitter 2314 may include a pass gate T237 which is turned on when a fourth bit DQ1B<4> of the first inverted control signals DQ1B<1:4> has a logic "H" level and an inverter IV234 which is connected to an output terminal of the pass gate T237. Thus, the fourth selection transmitter 2314 may invert a fourth bit DIN<4> of the input data DIN<1:4> to output the inverted data of the fourth bit DIN<4> as a fourth bit ID1<4> of the first internal data ID1<1:4> when the fourth bit DQ1B<4> has a logic "H" level. The fourth selection transmitter 2314 may further include a pass gate T238 which is turned on when the fourth bit DQ1B<4> of the first inverted control signals DQ1B<1:4> has a logic "L" level. Thus, the fourth selection transmitter 2314 may buffer the fourth bit DIN<4> of the input data DIN<1:4> to output the buffered data of the third bit DIN<3> as the fourth bit ID1<4> of the first internal data ID1<1:4> when the fourth bit DQ1B<4> has a logic "L" level.

Figure 5:
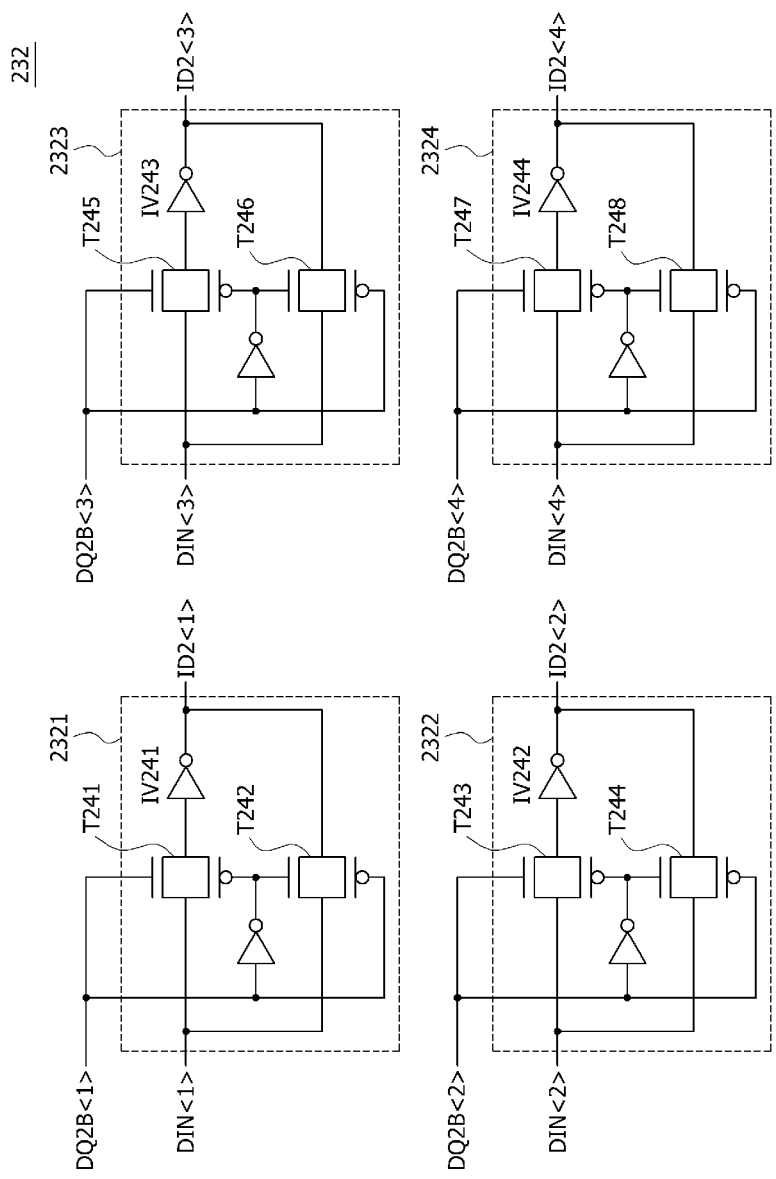
FIG. 5 is circuit diagram illustrating a configuration of a second data input unit included in the system of FIG. 1.

Referring to FIG. 5, the second data input unit 232 may be configured to include a fifth selection transmitter 2321, a sixth selection transmitter 2322, a seventh selection transmitter 2323 and an eighth selection transmitter 2324. The fifth selection transmitter 2321 may include a pass gate T241 which is turned on when a first bit DQ2B<1> of the second inverted control signals DQ2B<1:4> has a logic "H" level and an inverter IV241 which is connected to an output terminal of the pass gate T241. Thus, the fifth selection transmitter 2321 may invert a first bit DIN<1> of the input data DIN<1:4> to output the inverted data of the first bit DIN<1> as a first bit ID2<1> of the second internal data ID2<1:4> when the first bit DQ2B<1> has a logic "H" level. The fifth selection transmitter 2321 may further include a pass gate T242 which is turned on when the first bit DQ2B<1> of the second inverted control signals DQ2B<1:4> has a logic "L" level. Thus, the fifth selection transmitter 2321 may buffer the first bit DIN<1> of the input data DIN<1:4> to output the buffered data of the first bit DIN<1> as the first bit ID2<1> of the second internal data ID2<1:4> when the first bit DQ2B<1> has a logic "L" level.

The sixth selection transmitter 2322 may include a pass gate T243 which is turned on when a second bit DQ2B<2> of the second inverted control signals DQ2B<1:4> has a logic "H" level and an inverter IV242 which is connected to an output terminal of the pass gate T243. Thus, the sixth selection transmitter 2322 may invert a second bit DIN<2> of the input data DIN<1:4> to output the inverted data of the second bit DIN<2> as a second bit ID2<2> of the second internal data ID2<1:4> when the second bit DQ2B<2> has a logic "H" level. The sixth selection transmitter 2322 may further include a pass gate T244 which is turned on when the second bit DQ2B<2> of the second inverted control signals DQ2B<1:4> has a logic "L" level. Thus, the sixth selection transmitter 2322 may buffer the second bit DIN<2> of the input data DIN<1:4> to output the buffered data of the second bit DIN<2> as the second bit ID2<2> of the second internal data ID2<1:4> when the second bit DQ2B<2> has a logic "L" level.

The seventh selection transmitter 2323 may include a pass gate T245 which is turned on when a third bit DQ2B<3> of the second inverted control signals DQ2B<1:4> has a logic "H" level and an inverter IV243 which is connected to an output terminal of the pass gate T245. Thus, the seventh selection transmitter 2323 may invert a third bit DIN<3> of the input data DIN<1:4> to output the inverted data of the third bit DIN<3> as a third bit ID2<3> of the second internal data ID2<1:4> when the third bit DQ2B<3> has a logic "H" level. The seventh selection transmitter 2323 may further include a pass gate T246 which is turned on when the third bit DQ2B<3> of the second inverted control signals DQ2B<1:4> has a logic "L" level. Thus, the seventh selection transmitter 2323 may buffer the third bit DIN<3> of the input data DIN<1:4> to output the buffered data of the third bit DIN<3> as the third bit ID2<3> of the second internal data ID2<1:4> when the third bit DQ2B<3> has a logic "L" level.

The eighth selection transmitter 2324 may include a pass gate T247 which is turned on when a fourth bit DQ2B<4> of the second inverted control signals DQ2B<1:4> has a logic "H" level and an inverter IV244 which is connected to an output terminal of the pass gate T247. Thus, the eighth selection transmitter 2324 may invert a fourth bit DIN<4> of the input data DIN<1:4> to output the inverted data of the fourth bit DIN<4> as a fourth bit ID2<4> of the second internal data ID2<1:4> when the fourth bit DQ2B<4> has a logic "H" level. The eighth selection transmitter 2324 may further include a pass gate T248 which is turned on when the fourth bit DQ2B<4> of the second inverted control signals DQ2B<1:4> has a logic "L" level. Thus, the eighth selection transmitter 2324 may buffer the fourth bit DIN<4> of the input data DIN<1:4> to output the buffered data of the fourth bit DIN<4> as the fourth bit ID2<4> of the second internal data ID2<1:4> when the fourth bit DQ2B<4> has a logic "L" level.

Figure 6:
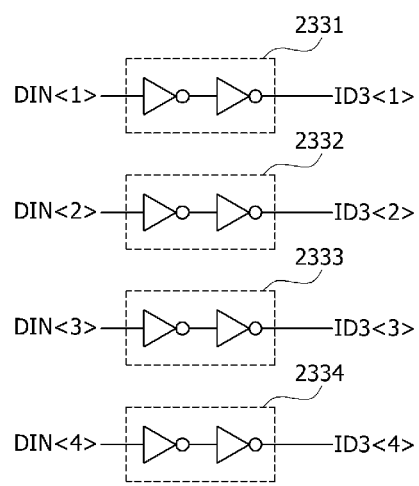
FIG. 6 is circuit diagram illustrating a configuration of a third data input unit included in the system of FIG. 1.

Referring to FIG. 6, the third data input unit 233 may be configured to include a first buffer 2331, a second buffer 2332, a third buffer 2333 and a fourth buffer 2334. The first buffer 2331 may buffer the first bit DIN<1> of the input data DIN<1:4> to output the buffered data of the first bit DIN<1> as a first bit ID3<1> of the third internal data ID3<1:4>. The second buffer 2332 may buffer the second bit DIN<2> of the input data DIN<1:4> to output the buffered data of the second bit DIN<2> as a second bit ID3<2> of the third internal data ID3<1:4>. The third buffer 2333 may buffer the third bit DIN<3> of the input data DIN<1:4> to output the buffered data of the third bit DIN<3> as a third bit ID3<3> of the third internal data ID3<1:4>. The fourth buffer 2334 may buffer the fourth bit DIN<4> of the input data DIN<1:4> to output the buffered data of the fourth bit DIN<4> as a fourth bit ID3<4> of the third internal data ID3<1:4>.

Now, an operation of the system having semiconductor devices set forth above will be described with reference to FIGS. 7 and 8.

Figure 7:
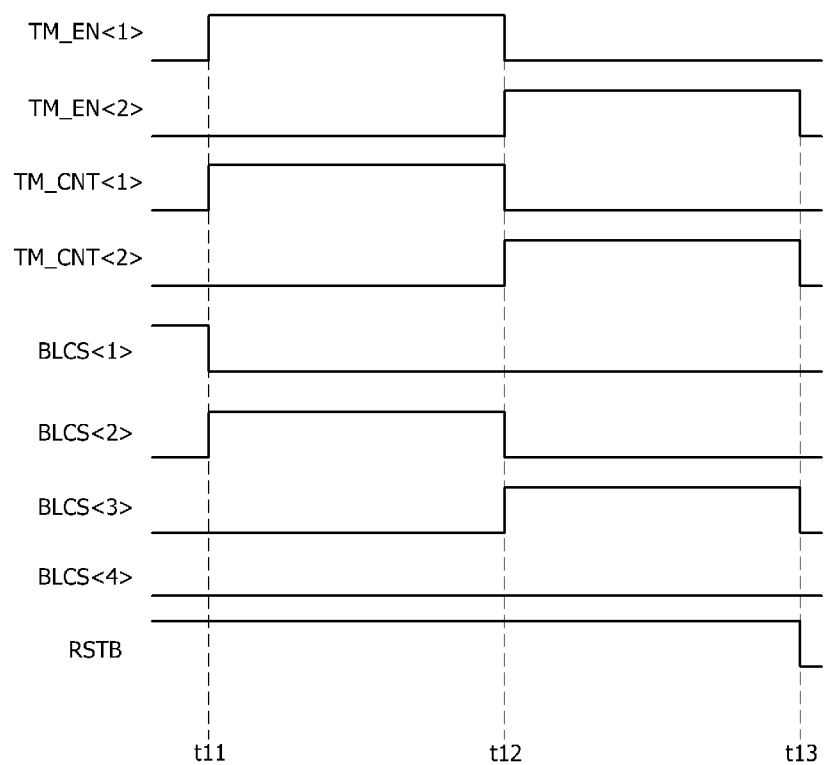
FIGS. 7 and 8 are timing diagrams illustrating an operation of generating internal data to test the system of FIG. 1.

As illustrated in FIG. 7, if the first and second test count signals TM_CNT<1:2> have a logic combination 'H, L' during a time period between a point of time t11 and a point of time t12, the decoded signals BLCS<1:4> may be generated to have a logic combination 'L, H, L, L'. Since the first test count signal TM_CNT<1> is enabled to have a logic "H" level during the time period t11-t12, the decoded signals BLCS<1:4> may be outputted as the first inverted control signals DQ1B<1:4>. Thus, the first inverted control signals DQ1B<1:4> may be generated to have a logic combination "L, H, L, L'.

if the first and second test count signals TM_CNT<1:2> have a logic combination 'L, H' during a time period between a point of time t12 and a point of time t13, the decoded signals BLCS<1:4> may be generated to have a logic combination 'L, L, H, L'. Since the second test count signal TM_CNT<2> is enabled to have a logic "H" level during the time period t12-t13, the decoded signals BLCS<1:4> may be outputted as the second inverted control signals DQ2B<1:4>. Thus, the second inverted control signals DQ2B<1:4> may be generated to have a logic combination "L, L, H, L'.

After the time period t12-t13, both the first and second test enable signals TM_EN<1:2> may be disabled to have logic "L" levels and the reset signal RSTB may be enabled to have a logic "L" level. Thus, the first and second inverted control signals DQ1B<1:4> and DQ2B<1:4> may be all reset. The first and second inverted control signals DQ1B<1:4> and DQ2B<1:4> may be reset to have logic "H" levels or logic "L" levels according to an embodiment of the present invention.

The logic combination 'H, L' of the first and second test count signals TM_CNT<1:2> denotes that the first test count signal TM_CNT<1> has a logic "H" level and the second test count signal TM_CNT<2> has a logic "L" level. Further, the logic combination 'L, H, L, L' of the decoded signals BLCS<1:4> denotes that the first, third and fourth bits BLCS<1>, BLCS<3> and BLCS<4> have logic "L" levels and only the second bit BLCS<2> has a logic "H" level. Furthermore, the logic combination 'L, H, L, L' of the first inverted control signals DQ1B<1:4> denotes that the first, third and fourth bits DQ1B<1>, DQ1B<3> and DQ1B<4> have logic "L" levels and only the second bit DQ1B<2> has a logic "H" level. Similarly, the logic combination 'L, H, L, L' of the second inverted control signals DQ2B<1:4> denotes that the first, third and fourth bits DQ2B<1>, DQ2B<3> and DQ2B<4> have logic "L" levels and only the second bit DQ2B<2> has a logic "H" level.

As described above, the first inverted control signals DQ1B<1:4> may be generated to have a logic combination 'L, H, L, L' during the time period t11-t12, and the second inverted control signals DQ2B<1:4> may be generated to have a logic combination 'L, L, H, L' during the time period t12-t13. Moreover, the first and second inverted control signals DQ1B<1:4> and DQ2B<1:4> may all be reset after the time period t12-t13. Under this circumstance, an operation of generating the first, second and third internal data ID1<1:4>, ID2<1:4> and ID3<1:4> will be described in detail with reference to FIG. 8.

Figure 8:
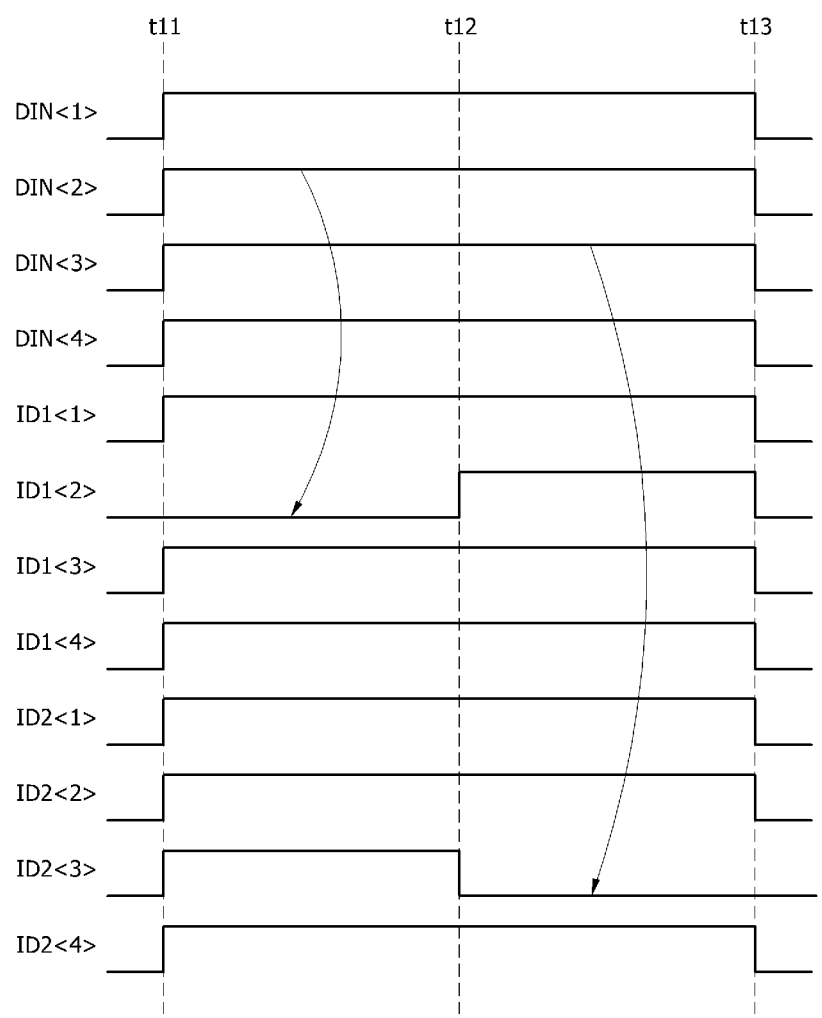

As illustrated in FIG. 8, all the input data DIN<1:4> may have logic "H" levels during the time period t11-t13. Since the first inverted control signals DQ1B<1:4> are generated to have a logic combination 'L, H, L, L' during the time period t11-t12, only the second bit of the input data DIN<1:4> may be inverted and the input data DIN<1:4> including the inverted second bit may be outputted as the first internal data ID1<1:4>. As a result, the first internal data ID1<1:4> may be generated to have a logic combination 'H, L, H, H'. Since the second inverted control signals DQ2B<1:4> are generated to have a logic combination 'L, L, H, L' during the time period t12-t13, only the third bit of the input data DIN<1:4> may be inverted and the input data DIN<1:4> including the inverted third bit may be outputted as the second internal data ID2<1:4>. As a result, the second internal data ID2<1:4> may be generated to have a logic combination 'H, H, L, H'. The third internal data ID3<1:4> may be generated to have the same logic levels as the input data DIN<1:4>. The first internal data ID1<1:4> generated to have topologies corresponding to the logic combination 'H, L, H, H' during the time period t11-t12, the second internal data ID2<1:4> generated to have topologies corresponding to the logic combination 'H, H, L, H' during the time period t12-t13, and the third internal data ID3<1:4> generated to have the same topologies as the input data DIN<1:4> may be stored in the core portion 24. The first, second and third internal data ID1<1:4>, ID2<1:4> and ID3<1:4> may be stored simultaneously or sequentially according to an embodiment of the present invention.

Although the present embodiment is described in conjunction with an example that the input data DIN<1:4> are inverted bit by bit to determine the topologies of the first and second internal data ID1<1:4> and ID2<1:4>, the inventive concept is not limited thereto. For example, in an embodiment of the present invention, the topologies of the first and second internal data ID1<1:4> and ID2<1:4> may be determined by inverting the input data DIN<1:4> two bits by two bits or more bits. That is, the configuration of the decoder 21 may be changed such that two bits or more bits of each of the first and second inverted control signals DQ1B<1:4> and DQ2B<1:4> are enabled.

In addition, although the present embodiment is described in conjunction with an example that the system includes the controller 1 and the semiconductor device 2, the inventive concept is not limited thereto. For example, the controller 1 may be replaced with a test equipment in order to perform a test for storing internal data having different topologies in the semiconductor device 2.

As described above, a system having a semiconductor device according to an embodiment of the present invention may determine which bit of the input data DIN<1:4> should be inverted, thereby generating internal data having different topologies from each other. Thus, tests may be performed by storing internal data having different topologies cell arrays of the semiconductor device included in a core portion of the system. According to an embodiment of the present invention, inversion of the input data DIN<1:4> may be determined by the bit thereof to generate the internal data having different topologies from each other. Thus, tests may be perform without receiving additional input data having different topologies from each other in order to generate the internal data. Accordingly, a test time of the semiconductor device may be reduced. In addition, various topologies of the internal data may be readily realized by inverting the input data DIN<1:4> by the bit. As a result, an area that semiconductor device occupies can be reduced.

The example embodiments of the inventive concept have been disclosed above for illustrative purposes. Those skilled in the art will appreciate that various modifications, additions and substitutions are possible, without departing from the scope and spirit of the inventive concept as disclosed in the accompanying claims.

What is claimed is:

1. A system comprising:
a controller configured to generate a test count signal, first and second test enable signals, and input data; and
a semiconductor device configured to determine inversion of respective bits of the input data in response to a first inverted control signal generated from decoded signals generated by decoding the test count signal to generate first internal data when the first test enable signal is enabled and configured to determine inversion of respective bits of the input data in response to a second inverted control signal generated from the decoded signals to generate second internal data when the second test enable signal is enabled.

2. The system of claim 1, wherein the controller is configured to apply the first and second test enable signals sequentially enabled during a time period that the semiconductor device receives the test count signal and the input data to the semiconductor device.

3. The system of claim 2, wherein the controller is configured to apply a reset signal for resetting the first and second inverted control signals to the semiconductor device when both the first and second test enable signals are disabled after the first and second test enable signals are sequentially enabled.

4. The system of claim 1, wherein the semiconductor includes:
a first data input unit configured to invert a first bit of the input data in response to a first bit of the first inverted control signal to generate a first bit of the first internal data and configured to invert a second bit of the input data in response to a second bit of the first inverted control signal to generate a second bit of the first internal data while the first test enable signal is enabled; and
a second data input unit configured to invert the first bit of the input data in response to a first bit of the second inverted control signal to generate a first bit of the second internal data and configured to invert the second bit of the input data in response to a second bit of the second inverted control signal to generate a second bit of the second internal data while the second test enable signal is enabled.

5. The system of claim 4, further comprising a control signal generator,
wherein the control signal generator is configured to output a first bit of the decoded signals as the first bit of the first inverted control signal and configured to output a second bit of the decoded signals as the second bit of the first inverted control signal while the first test enable signal is enabled.

6. The system of claim 5, wherein the control signal generator is configured to output the first bit of the decoded signals as the first bit of the second inverted control signal and configured to output the second bit of the decoded signals as the second bit of the second inverted control signal while the second test enable signal is enabled.

7. The system of claim 4:
wherein the first data input unit is configured to invert the first bit of the input data to output the inverted data of the first bit of the input data as the first bit of the first internal data when the first bit of the first inverted control signal has a first logic level; and
wherein the first data input unit is configured to buffer the first bit of the input data to output the buffered data of the first bit of the input data as the first bit of the first internal data when the first bit of the first inverted control signal has a second logic level.

8. The system of claim 7:
wherein the first data input unit is configured to invert the second bit of the input data to output the inverted data of the second bit of the input data as the second bit of the first internal data when the second bit of the first inverted control signal has the first logic level; and
wherein the first data input unit is configured to buffer the second bit of the input data to output the buffered data of the second bit of the input data as the second bit of the first internal data when the second bit of the first inverted control signal has the second logic level.

9. The system of claim 4:
wherein the second data input unit is configured to invert the first bit of the input data to output the inverted data of the first bit of the input data as the first bit of the second internal data when the first bit of the second inverted control signal has a first logic level; and
wherein the second data input unit is configured to buffer the first bit of the input data to output the buffered data of the first bit of the input data as the first bit of the second internal data when the first bit of the second inverted control signal has a second logic level.

10. The system of claim 9:
wherein the second data input unit is configured to invert the second bit of the input data to output the inverted data of the second bit of the input data as the second bit of the second internal data when the second bit of the second inverted control signal has the first logic level; and
wherein the second data input unit is configured to buffer the second bit of the input data to output the buffered data of the second bit of the input data as the second bit of the second internal data when the second bit of the second inverted control signal has the second logic level.

11. The system of claim 4, further comprising a third input unit,
wherein the third input unit is configured to buffer the first bit of the input data to output the buffered data of the first bit of the input data as a first bit of third internal data and configured to buffer the second bit of the input data to output the buffered data of the second bit of the input data as a second bit of the third internal data.

12. The system of claim 4, further comprising a core portion configured to include cell arrays in which the first, second and third internal data are stored when a write operation for testing is performed.

* * * * *